US006683011B2

(12) United States Patent
Smith et al.

(10) Patent No.: US 6,683,011 B2
(45) Date of Patent: Jan. 27, 2004

(54) PROCESS FOR FORMING HAFNIUM OXIDE FILMS

(75) Inventors: Ryan C. Smith, Roseville, MN (US); Tiezhong Ma, San Jose, CA (US); Stephen A. Campbell, Shoreview, MN (US); Wayne L. Gladfelter, Roseville, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 52 days.

(21) Appl. No.: 09/992,173

(22) Filed: Nov. 14, 2001

(65) Prior Publication Data

US 2003/0092287 A1 May 15, 2003

(51) Int. Cl.[7] .................... H01L 21/469; H01L 21/8238
(52) U.S. Cl. .................. 438/785; 438/591; 257/E21.639
(58) Field of Search ......................... 438/591, 773–775, 438/784–785, 287, FOR 395; 427/99, 126.3, 255.31; 257/E21.639

(56) References Cited

U.S. PATENT DOCUMENTS 6,203,613 B1    3/2001   Gates et al.

OTHER PUBLICATIONS

Smith et al., "Chemical Vapour Deposition of the Oxides of Titanium, Zirconium and Hafnium for Use as High–K Materials in Microelectronic Devices . . . ", Jun. 2000, Advanced Materials for Opticsand Electronics InterScience: Journal Subsciption and Available Issue online information (citation), http://www3.interscience.wiley.com.*

Smith et al., "Chemical Vapour Deposition of the Oxides of Titanium, Zirconium and Hafnium for Use as High–K Materials in Microelectronic Devices . . . ", Jun. 2000, Advanced Materials for Opticsand Electronics 10, pp105–114.*

Colombo et al., "Anhydrous Metal Nitrates as Volatile Single Source Precursors for the CVD of Metal Oxide Films," Chem. Vap. Deposition, 1998, 4(6):220–222.

Gilmer et al., "Low Temperature CVD of Crystalline Titanium Dioxide Films Using Tetranitratotitanium(IV),"Chem. Vap. Deposition, 1998, 4(1): 9–11.

Taylor et al., "Does Chemistry Really Matter in the Chemical Vapor Deposition of Titanium Dioxide? Precursor and Kinetic Effects on the Microstructure of Polycrystalline Films," J. Am. Chem. Soc., 1999, 121:5220–5229.

* cited by examiner

Primary Examiner—George Fourson
Assistant Examiner—Thanh V. Pham
(74) Attorney, Agent, or Firm—Fish & Richardson, P.C., P.A.

(57) ABSTRACT

A process for forming a hafnium oxide-containing film on a substrate such as silicon that includes introducing an anhydrous hafnium nitrate-containing precursor into a reactor containing the substrate, and converting the precursor into the hafnium oxide-containing film on the substrate by chemical vapor deposition.

9 Claims, 1 Drawing Sheet

PROCESS FOR FORMING HAFNIUM OXIDE FILMS

This invention was made with government support under CHE-9616501 awarded by the National Science Foundation. The government has certain rights in the invention.

TECHNICAL FIELD

This invention relates to forming a hafnium oxide film on a substrate by chemical vapor deposition.

BACKGROUND

A number of materials have been proposed as replacements for silicon dioxide as the gate dielectric in metal oxide semiconductor field effect transistors (MOSFETs). Examples include oxides of titanium, zirconium, and hafnium. These materials have higher dielectric constants than silicon dioxide, making it possible to achieve an equivalent capacitance using a thicker layer. The thicker layer, in turn, reduces leakage current.

SUMMARY

In general, the invention features a process for forming a hafnium oxide-containing film on a substrate such as silicon that includes introducing an anhydrous hafnium nitrate-containing precursor into a reactor containing the substrate, and converting the precursor into the hafnium oxide-containing film on the substrate by chemical vapor deposition. The precursor may be introduced into the reactor in the form of a gas or a liquid. It may be used alone or in combination with a carrier gas such as nitrogen. The hafnium nitrate may be used as a single source precursor or in the presence of an additional oxygen source such as oxygen ($O_2$), ozone ($O_3$), water ($H_2O$) or hydrogen peroxide ($H_2O_2$).

Using a hafnium nitrate-containing precursor eliminates the need for a separate oxidizing agent such as oxygen. In addition, because the precursor is free of carbon, hydrogen, and halogen atoms, impurities in the final film are minimized.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
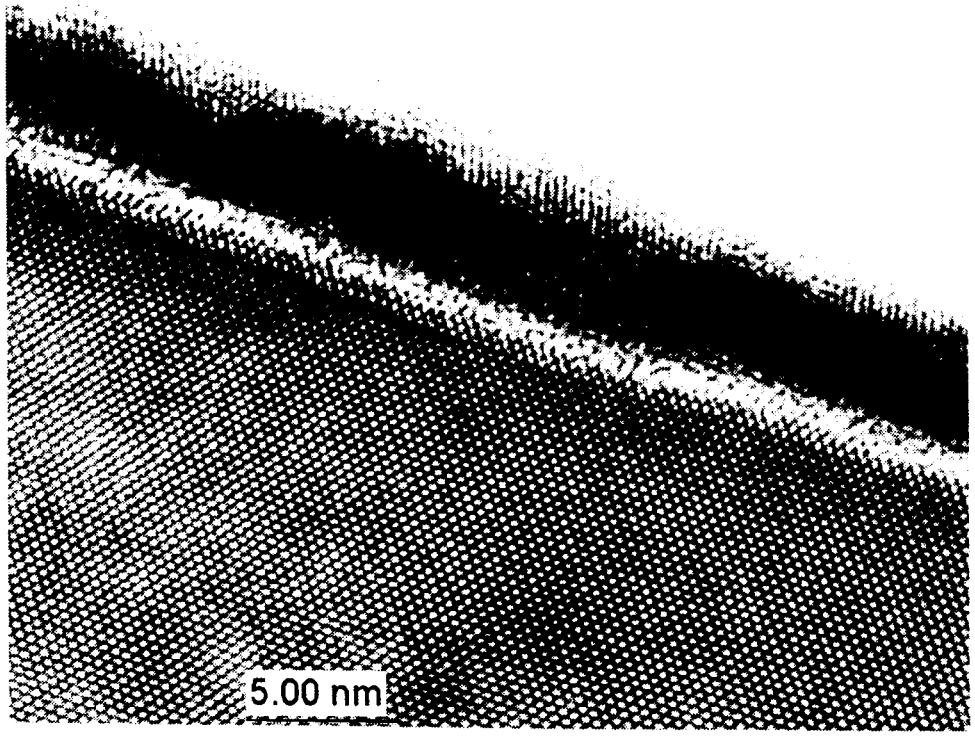
FIG. 1 is a view of a $HfO_2$ film deposited on Si(100) obtained using cross-sectional transmission electron microscopy.

In the process of the invention, thin films of $HfO_2$ are grown using a precursor of anhydrous hafnium (IV) nitrate ("HN"). The HN may be synthesized using well known techniques, and is typically the reaction product of $HfCl_4$ and $N_2O_5$. The reaction product is preferably purified by sublimation, and may be stored under an inert atmosphere.

The HN is initially loaded into a precursor vessel under an inert atmosphere. The HN precursor vessel is then preferably heated to an appropriate temperature, typically about 80° C., and the chamber of the precursor vessel is maintained at below atmospheric pressure, typically at about 0.20 Torr.

The HN is deposited on a substrate to form a thin film using a chemical vapor deposition process. Suitable substrates include Si(100) and the like. The substrates are typically mounted on a heated susceptor situated in a low pressure reactor at a pressure of less than about 1 mTorr. Suitable susceptors are made from molybdenum, and are heated temperatures between 300 and 500° C. during the deposition process. Thin film growth rates typically range from about 2.5 to about 10.0 nm per minute. The resulting deposited films are polycrystalline, monoclinic $HfO_2$.

The HN may optionally be deposited with an inert carrier gas. The carrier gas may vary widely, but nitrogen, preferably highly purified nitrogen, is suitable. Alternatively, the HN precursor may be deposited in the presence of an additional oxygen source such as oxygen ($O_2$), ozone ($O_3$), water ($H_2O$) or hydrogen peroxide ($H_2O_2$).

EXAMPLE

The deposition of the HN was performed in a stainless steel low-pressure reactor, which consisted of a six-way cross equipped with 4.5 inch diameter Conflat flanges. Using only the mechanical pump, the base pressure of the reactor was <1 mTorr. Two of the flanges were unused. One flange was equipped with a Viton™ o-ring sealed door for wafer loading. The precursor line enters the chamber through the top flange and the bottom flange is capped with fused silica window sealed to the flange knife-edge with a Viton™ o-ring. The Si(100) substrates were cleaned by standard procedures and placed onto a circular molybdenum susceptor (⅛-inch thick) situated at the center of the reactor. The molybdenum susceptor was heated with a Variac-controlled, 1000 Watt, quartz halogen lamp located in a parabolic aluminum reflector and directed through the fused silica window. The temperature of the susceptor was measured with a K-type thermocouple embedded one centimeter into the side of the susceptor. The final flange was connected to the exhaust line that led through a Lindberg tube furnace set to 500° C. to destroy any unreacted precursor, a particle filter and, finally, to the mechanical pump. A thermocouple gauge located between the six-way cross and the cracking furnace measured the reactor pressure.

The HN precursor vessel was heated to the desired temperature, 80° C., by Variac-controlled heating tape. High purity nitrogen was used as the carrier gas. The flow of carrier gas was maintained at the desired flow, 20 sccm, using a mass flow controller. The chamber pressure during deposition was 0.20 Torr. The films were deposited at susceptor temperatures between 300 and 500° C. Under these conditions the observed growth rates ranged from 2.5 to 10.0 nm per minute.

Film crystallinity was studied using a Siemans D-5005 X-ray diffractometer and showed that films grown at 450° C. were polycrystalline, monoclinic $HfO_2$. The observed preferential orientation was difficult to determine because of the close spacing and broadening of many of the reflections. The four strongest reflections occurred at 24.5, 28.6, 31.6, and 35.0°. The low angle peak could be attributed to either the 011 or 110 reflections, and the high angle peak could be due to the 002 or 200 reflections. The peaks at 28.6° and 31.6° could be uniquely assigned to the $\bar{1}$ 11 and 111 reflections, respectively.

The Rutherford backscattering spectrum was obtained on a spectrometer purchased from NEC that was equipped with a MAS 1700 end station. The $He^+$ beam had an energy of 2.0 MeV, and the charge collected was typically 10 $\mu C$ using a beam current of 15 nA. Medium energy ion scattering data using a $He^+$ beam suggests that the ratio of O to metal in such high permittivity films is high by approximately 10%.

After adjusting the RBS data, the stoichiometry of the as-deposited films ranged from $HfO_{2.2}$ to $HfO_{2.4}$. The observed ratio of O to Hf was higher for films that were deposited at lower temperatures. Other metal oxides deposited using anhydrous metal nitrates were reported to contain excess oxygen, which could be removed by heating the films under an inert atmosphere.

A number of embodiments of the invention have been described. Nevertheless, it will be understood that various modifications may be made without departing from the spirit and scope of the invention. Accordingly, other embodiments are within the scope of the following claims.

What is claimed is:

1. A process for forming a film on a substrate, said process comprising introducing a precursor comprising anhydrous hafnium nitrate into a reactor containing the substrate, and converting the precursor into a film comprising hafnium oxide on the substrate by chemical vapor deposition.

2. A process according to claim 1 wherein the substrate comprises a silicon substrate.

3. A process according to claim 1 comprising introducing the precursor into the reactor in the form of a gas.

4. A process according to claim 1 comprising the precursor into the reactor in the form of a liquid.

5. A process according to claim 1 comprising forming the film at a rate ranging from about 2.5 to about 10 nm/min.

6. A process according to claim 1 further comprising introducing a carrier gas into the reactor with the precursor.

7. A process according to claim 1 further comprising introducing an additional oxygen source, into the reactor with the precursor.

8. The process of claim 7, wherein the additional oxygen source is selected from the group consisting of oxygen ($O_2$), ozone ($O_3$), water ($H_2O$) and hydrogen peroxide ($H_2O_2$).

9. The process of claim 6, wherein the carrier gas is nitrogen.

* * * * *